United States Patent
Polasa et al.

(10) Patent No.: US 11,442,805 B1
(45) Date of Patent: Sep. 13, 2022

(54) SYSTEM AND METHOD FOR DEBUGGING MICROCONTROLLER USING LOW-BANDWIDTH REAL-TIME TRACE

(71) Applicant: SILICONCH SYSTEMS PVT LTD, Karnataka (IN)

(72) Inventors: Rakesh Kumar Polasa, Karnataka (IN); Shrikantha Venkatesh, Karnataka (IN); Harshith Subramanya, Karnataka (IN)

(73) Assignee: SILICONCH SYSTEMS PVT LTD, Karnataka (IN)

( * ) Notice: Subject to any disclaimer, the term of this patent is extended or adjusted under 35 U.S.C. 154(b) by 0 days.

(21) Appl. No.: 17/362,781

(22) Filed: Jun. 29, 2021

(30) Foreign Application Priority Data

Mar. 3, 2021 (IN) .............................. 202141008962

(51) Int. Cl.
 *G06F 11/00* (2006.01)
 *G06F 11/07* (2006.01)
 *G01R 31/3177* (2006.01)

(52) U.S. Cl.
 CPC ...... *G06F 11/0793* (2013.01); *G01R 31/3177* (2013.01); *G06F 11/0721* (2013.01)

(58) Field of Classification Search
 CPC ............ G06F 11/0793; G06F 11/0721; G06F 11/0706; G06F 11/0703; G06F 11/1048; G06F 11/3656; G06F 11/362; G06F 11/3624; G06F 11/3636; G06F 11/3664
 See application file for complete search history.

(56) References Cited

U.S. PATENT DOCUMENTS

2013/0297974 A1* 11/2013 Milks .................. G06F 11/3656
 714/30

OTHER PUBLICATIONS

Universal Serial Bus Type-C Cable and Connector Specification Release 2.0, USB 3.0 Promoter Group, Aug. 2019 (373 pages).
Universal Serial Bus Power Delivery Specification, Revision 3.0, Version 2.0, Aug. 29, 2019 (657 pages).

* cited by examiner

*Primary Examiner* — Katherine Lin
(74) *Attorney, Agent, or Firm* — Procopio, Cory, Hargreaves & Savitch LLP

(57) ABSTRACT

The present disclosure relates to a system for real-time debugging of microcontroller, the system includes a microcontroller configured in an embedded device to execute a set of instructions, the microcontroller includes a counter unit that generates a set of values for the executed set of instructions. An on-chip debugger (OCD) fetches a selective set of data packets of the set of instructions from the microcontroller. An encoder encodes the selective set of data packets to store the encoded set of data packets in a storage unit, wherein encoding of the set of data packets is performed to compress the data for minimal information size such that the external debugger unit (EDU) receives the encoded set of data packets with minimal information size through the external interface.

10 Claims, 3 Drawing Sheets

SYSTEM AND METHOD FOR DEBUGGING MICROCONTROLLER USING LOW-BANDWIDTH REAL-TIME TRACE

CROSS-REFERENCE TO RELATED APPLICATIONS

This application claims priority to India Patent Application No. 2021-41008962 filed on Mar. 3, 2021, the contents of which are incorporated herein by reference in its entirety for all purposes.

BACKGROUND

Technical Field

The present disclosure relates, in general, to a debugging system, and more specifically, relates to a system and method for debugging firmware running on microcontroller (MCU) using low-bandwidth real-time trace.

Related Art

Embedded systems may include an electrical system controlled by processors, as well as memory and input/output (I/O) units. The firmware for these embedded systems can be quite tedious. As multiple modules and their communications occur internally to the chip, access to this information is generally difficult when problems occur in software or hardware. Real-time debugging is crucial for the application as firmware flow is essential.

Examples of related art technologies in the field of real-time debugging includes light-emitting diode (LED) \pin toggling-based debug, real-time tracing systems and printf process. Such related art implementations suffer from the limitations of the requirement of dedicated pins, the need for faster equipment to perform faster debugging to get the pin toggling, the high-frequency systems (high bandwidth) needed for the on-chip debugger and the external debugging unit, the high internal buffer for storing the entire firmware flow, and occupies more firmware size, as debug related codes are added, which might be costly for one-time programmable memories.

Therefore, there is a need in the art to provide a means that can exhibit real-time debugging by using low-frequency components, low bandwidth interface, and thereby can be designed in a simple, low-cost fashion.

SUMMARY

An object of the present disclosure relates, in general, to a debugging system, and more specifically, relates to a system and method for debugging firmware running on a microcontroller (MCU) using a low-bandwidth real-time trace.

Another object of the present disclosure is to provide a system that may eliminate memory and high-speed requirements by storing minimal information.

Another object of the present disclosure is to provide a system that can send minimal information such as entry data, exit data in the on-chip debugger and code addition in firmware is avoided.

Another object of the present disclosure is to provide a system that can be operated at lower frequency and lower bandwidth, since minimal information is stored in the on-chip debugger. The parts of transmitted information can be lost/corrupted as a part of communication from on-chip debugger (OCD) to external debugger unit (EDU). EDU is equipped with a feature to correct these errors based on the firmware flow/context.

Another object of the present disclosure is to provide a system in which the internal FIFO/buffer size is smaller leading to silicon area savings.

Another object of the present disclosure is to provide a system that can transmit only a part of a program counter (PC) for entry and exit of the function in an encoded manner, thus utilizing lower bandwidth interface, and the decoding of the encoded PC may be performed at the external debugging unit.

Another object of the present disclosure reduces the cost of real-time debugging by using low frequency components in the external debugger unit.

Another object of the present disclosure is to provide a system that can dynamically correct any error in the communication at the external debugger side, as the trace information is known.

Yet another object of the present disclosure a system that can reduce information bandwidth by splitting and taking complementary program counter bits for entry/exit calls respectively, and information may be re-constructed at the external debugger side effectively.

The present disclosure relates, in general, to a debugging system, and more specifically, relates to a system and method for debugging firmware running on microcontroller (MCU) using low-bandwidth real-time trace.

In an aspect, the present disclosure provides a system for real-time debugging, the system including a microcontroller configured in an embedded device to execute a set of instructions, the microcontroller comprising a counter unit that generates a set of values for the executed set of instructions, on-chip debugger (OCD) operatively coupled to the microcontroller, the on-chip debugger fetches a selective set of data packets of the set of instructions from the microcontroller, the selective set of data packets pertaining to trace data that involves the set of values for any or a combination of entry data, exit data, and goto data, wherein the entry data and exit data pertaining to functions which includes interrupt service routines, bootloader and compiler, an encoder configured in the on-chip debugger, the encoder encodes the selective set of data packets to store the encoded set of data packets in a storage unit; and an external debugger unit (EDU) operatively coupled to the on-chip debugger through an interface, the external debugger unit receives the encoded set of data packets from the on-chip debugger through the interface, the encoding of the set of data packets is performed to compress the data for minimal information size such that the external debugger unit receives the encoded set of data packets with minimal information size through the external interface, wherein, the external debugger unit identifies the encoded set of data packets received from the OCD, based on matching of the encoded set of data packets with reference set of data packets, and wherein, the external debugger unit decodes the encoded set of data packets to form the meaningful set of instructions, the external debugger unit rectifies any or a combination of physical communication interface errors and decoding errors In an embodiment, most significant bit (MSB) of the program counter unit may be pushed after the completion of the entry data and a least significant bit (LSB) of the program counter unit may be pushed when the instruction is being exit.

In another embodiment, the external debugging unit may match the last exit data with the last entry data to decode the encoded set of data packets.

In another embodiment, the storage unit configured in the on-chip debugger to store the selective set of data packets.

In another embodiment, the storage unit is a first in first out (FIFO) buffer.

In another embodiment, the interface may be any or a combination of 1/2/4-wire, and joint test action group (JTAG).

In another embodiment, the external debugger unit may interact with the on-chip debugger unit through the 1/2/4-wire or JTAG interface In another embodiment, the on-chip debugger unit may include a transmitter that access the encoded set of data packets from the FIFO.

In another embodiment, the external debugging unit comprises a decoder to decode the encoded set of data packets, wherein the reference set of data packets of EDU contains a copy of the entire firmware to trace the firmware and rectify the errors in decoding depending on the context when comparing with the EDU firmware copy, wherein the parts of transmitted information is lost/corrupted as a part of communication from on-chip debugger to external debugger unit, the external debugger unit is equipped with a feature to correct these errors based on the firmware flow/context.

In an aspect, the present disclosure provides a method for real-time debugging, the method includes executing, at a microcontroller, a set of instructions, the microcontroller comprising a counter unit that generates a set of values for the executed set of instructions, fetching, from the microcontroller, a selective set of data packets of the set of instructions, by an on-chip debugger (OCD), the selective set of data packets pertaining to trace data that comprises the set of values for any or a combination of entry data, exit data, and goto data, wherein the entry data and exit data pertaining to functions which includes interrupt service routines, bootloader and compiler, the on-chip debugger operatively coupled to the microcontroller, encoding, at an encoder, the selective set of data packets to store the encoded set of data packets in a storage unit, and receiving, at an external debugger unit (EDU), the encoded set of data packets from the on-chip debugger through an interface, the encoding is performed to compress the data for minimal information size such that the external debugger unit receives the encoded set of data packets with minimal information size through the external interface, wherein, the external debugger unit identifies the encoded set of data packets received from the OCD, based on matching of the encoded set of data packets with reference set of data packets, and wherein, the external debugger unit decodes the encoded set of data packets to form the meaningful set of instructions, the external debugger unit rectifies any or a combination of physical communication interface errors and decoding errors.

Various objects, features, aspects, and advantages of the inventive subject matter will become more apparent from the following detailed description of preferred embodiments, along with the accompanying drawing figures in which like numerals represent like components.

BRIEF DESCRIPTION OF THE DRAWINGS

The following drawings form part of the present specification and are included to further illustrate aspects of the present disclosure. The disclosure may be better understood by reference to the drawings in combination with the detailed description of the specific embodiments presented herein.

DETAILED DESCRIPTION

The following is a detailed description of embodiments of the disclosure depicted in the accompanying drawings. The embodiments are in such detail as to clearly communicate the disclosure. If the specification states a component or feature "may", "can", "could", or "might" be included or have a characteristic, that particular component or feature is not required to be included or have the characteristic.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

The present disclosure relates, in general, to a debugging system, and more specifically, relates to a system and method for debugging microcontroller (MCU) using low-bandwidth real-time trace. The system may include an on-chip debugger, which helps in collecting the function entry/exit and jump to/from interrupt service routines and fills the storage unit, for example, FIFO/buffer, based on the configuration. The present disclosure is an efficient method, which can be used for real-time debugging of a set of instructions with minimal storage unit and frequency requirements. An external debugger unit EDU helps to recognize the received serial data and translates the received serial data into meaningful firmware flow information in real-time. The system can reduce the amount of space required to store trace data on-chip as well as reduce the amount of off-chip data transfer.

The present disclosure debugs a live microcontroller (MCU) running in any embedded application. The debugging happens through storing the minimal information of calls to the different functions, exits from those function, jump to/from interrupt service routines and the like, instead of tracing the entire program counter flow. The minimal information is stored into a storage unit, which is present in the system and constitutes part of the on-chip debugger. The recursive calls to a function are understood by the on-chip debugger system and masked by it. The external debugging unit interacts with the on-chip debugger through either 1/2/4-wire and JTAG debugging interfaces. The on-chip debugger also has a facility to track only a portion of the code if needed based on the configuration from the external debugger unit. The present disclosure can be described in enabling detail in the following examples, which may represent more than one embodiment of the present disclosure.

Figure 1:
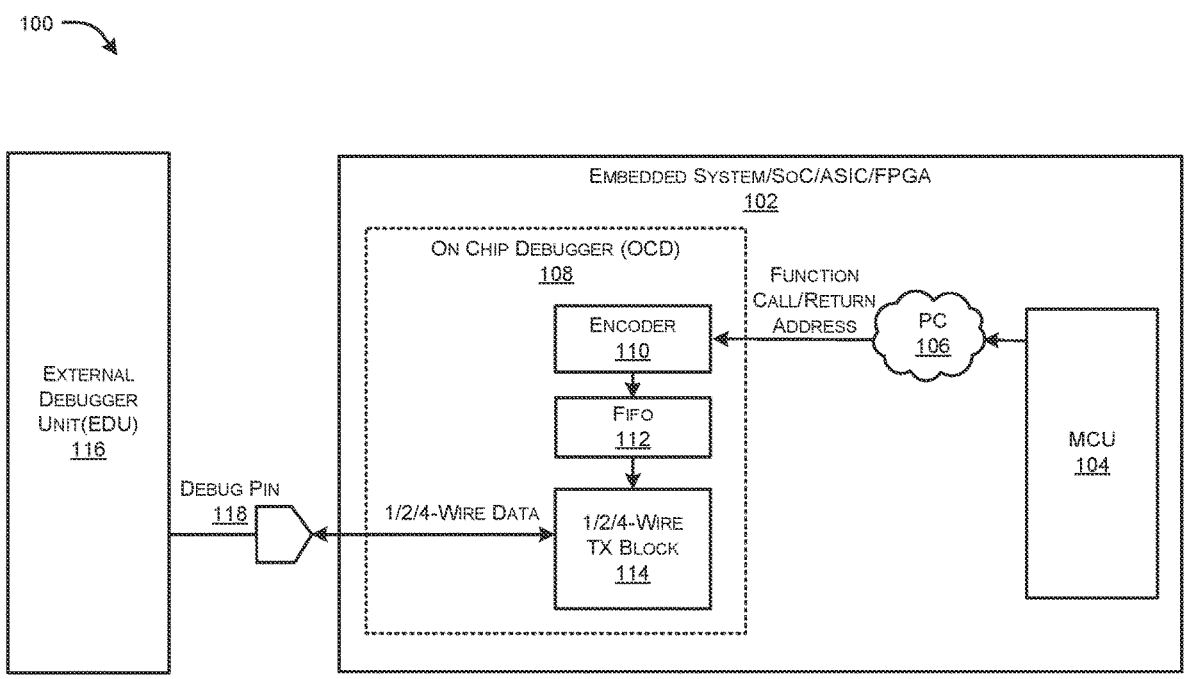
FIG. 1 illustrates an exemplary representation of a system for real time debugging of microcontroller, in accordance with an embodiment of the present disclosure.

FIG. 1 illustrates an exemplary representation of a system for real time debugging of microcontroller, in accordance with an embodiment of the present disclosure.

Referring to FIG. 1, debugging system 100 (also referred to as a system 100, herein) configured to debug a target circuit running in an embedded device 102 to analyse an operation of the target circuit, where the embedded device 102 can be any or a combination of application-specific integrated circuit (ASIC), system on a chip (SoC), and field-programmable gate arrays (FPGA). The system 100 can reduce the amount of space required to store trace data on-chip as well as reduce the amount of off-chip data transfer. The system 100 may include the embedded device 102, an external debugger unit (EDU) 116, and an external interface 118. The embedded device 102 may include the target circuit 104, and an on-chip debugger (OCD) 108. Further, the on-chip debugger 108 may be coupled to the external debugger unit 116 through the external interface 118, where the on-chip debugger 108 may process the received information and may send the processed information to the external debugger unit 116 to perform real-time tracing.

In an exemplary embodiment, the target circuit 104 as presented in the example may be a microcontroller (MCU). As can be appreciated, the present disclosure may not be limited to this configuration but may be extended to other configurations. The microcontroller 104 configured in the embedded device 102 may execute a set of instructions, the microcontroller 104 may include a counter unit 106 also interchangeably referred to as program counter (PC) unit that generates a set of values for the executed set of instructions.

In an embodiment, the on-chip debugger 108 is operatively coupled to the microcontroller 104, where the on-chip debugger 108 may include an encoder 110, a storage unit 112, and a debug transmitter 114. The on-chip debugger 108 may fetch a selective set of data packets of the set of instructions from the microcontroller 104, the selective set of data packets pertaining to trace data that may include the set of values of any or a combination of entry data, exit data, and goto/jump data. The entry data and exit data pertaining to functions which includes interrupt service routines, bootloader and compiler introduced function because of optimizations.

The set of values may include the address of the entry data, exit data, and goto/jump data. The on-chip debugger 108 may include the encoder 110 that may encode the selective set of data packets and the storage unit 112 that may store the encoded set of data packets received from the encoder 110. In an exemplary embodiment, the storage unit 112 may be a physical first in first out (FIFO) buffer, or any type of physical memory in accordance with the desired implementation.

For example, the on-chip debugger 108 functionality helps in collecting the function entry/exit and jump to/from interrupt service routines and fills the buffer 112 based on the configuration. The debugging may happen through storing the minimal information of calls to the different functions, exits from those function, jump to/from interrupt service routines instead of tracing the entire program counter flow. The buffer 112 can be configured to mask recursive function calls. Thus, by using the FIFO/buffer 112 for storing the minimal information of data packets e.g., calls, the memory and high-speed requirement may be eliminated, i.e., save storage space, and reduce an amount of bandwidth needed to transfer the trace data/information to the external debugger unit.

In another embodiment, data to FIFO 112 may be pushed whenever there is a function call, a function return and jumps to/from interrupt service routines. On every call, the MSB in the PC 106 may be pushed after the completion of the call instruction and on every return, the LSB of the PC 106 which also includes the identification bits may be pushed when the instruction is being exit. The abovementioned process may provide sufficient information required for knowing the set of instructions flow. Thus, the information bandwidth may be reduced by splitting and taking complementary program counter bits for entry/exit calls respectively, and the information is re-constructed at the external debugger side.

The debug transmitter 114 may access data from FIFO 112 after the transmission of the previous byte until the FIFO/buffer 112 reaches an empty state, where the transmission of data can be achieved by the external interface 118. In another embodiment, the external debugger unit 116 operatively coupled to the on-chip debugger 108 through the external interface 118. In an exemplary embodiment, the external interface 118 as presented in the example may be 1/2/4-wire debugging interfaces. As can be appreciated, the present disclosure may not be limited to this configuration but may be extended to other configurations such as joint test action group (JTAG) and the like.

The external debugger unit 116 can access the microcontroller 104 through serial communications. The external debugger unit 116 may receive the encoded set of data packets also interchangeably referred to as serial data from the on-chip debugger 108 through the external interface 118. The encoding of the set of data packets is performed to compress the data for minimal information size such that the external debugger unit 116 may receive the encoded set of data packets with minimal information size through the external interface 118. The external debugger unit 116 is more intelligent and can rectify the any or a combination of physical communication interface errors and decoding errors, where the physical communication interface errors may be caused due to the physical interface. The external debugger unit 116 has a copy of the entire firmware and it can trace the firmware with the firmware copy that it contains. The external debugger unit 116 rectifies the errors in decoding (error due to physical medium and compression losses) depending on the context when comparing with the EDU firmware copy. The parts of transmitted information can be lost/corrupted as a part of communication from on-chip debugger 108 to external debugger unit 116, the external debugger unit 116 is equipped with a feature to correct these errors based on the firmware flow/context.

The external debugger unit 116 may identify the encoded set of data packets received from the on-chip debugger 108 based on the matching of the encoded set of data packets with a reference set of data packets. The external debugger unit 116 may decode the encoded set of data packets to form the meaningful set of instructions, where the reference set of data packets may include stored entry and exit address of the set of instructions in the external debugger unit 116. The reference set of data packets may contain the copy of the entire firmware and it can trace the firmware with the firmware copy that it contains.

For example, external debugger unit 116 may be provided with the set of instructions, e.g., firmware with all information such as entry and exit addresses of all functions prior. On receiving the debug/trace data, external debugger unit 116 may map these received data packets with the reference set of data packets. Based on the presence of identification bits, the external debugger unit 116 may infer whether the received data is for a function call or function return. It tries to match the last return address with last called address and hence matching the set of instructions, e.g., firmware flow. Thus, the information of microcontroller 104, which is working in a very high frequency can be reciprocated to the outer interface with external debugger unit 116, which is working at a lower frequency compared to the microcontroller 104 i.e., low bandwidth interface may be used for the information transmission.

Thus, system 100 may eliminate memory and high-speed requirement by using the FIFO/buffer 112 for storing the minimal information of calls. The debugging unit supports selective tracing when the selected function routines executed. The information bandwidth may be reduced by splitting and taking complementary program counter bits for entry/exit calls respectively, and information may be re-constructed at the external debugger side effectively. The system 100 can dynamically correct any error in the communication at the external debugger side, as the call trace information is known. As the debugging information is reduced attributed to minimal information and to the splitting of the information, the information can be relayed using low bandwidth interface depending on the speed of the microcontroller 104, and any optimizations performed by the compiler/linker are also considered in the trace debugging.

Figure 2:
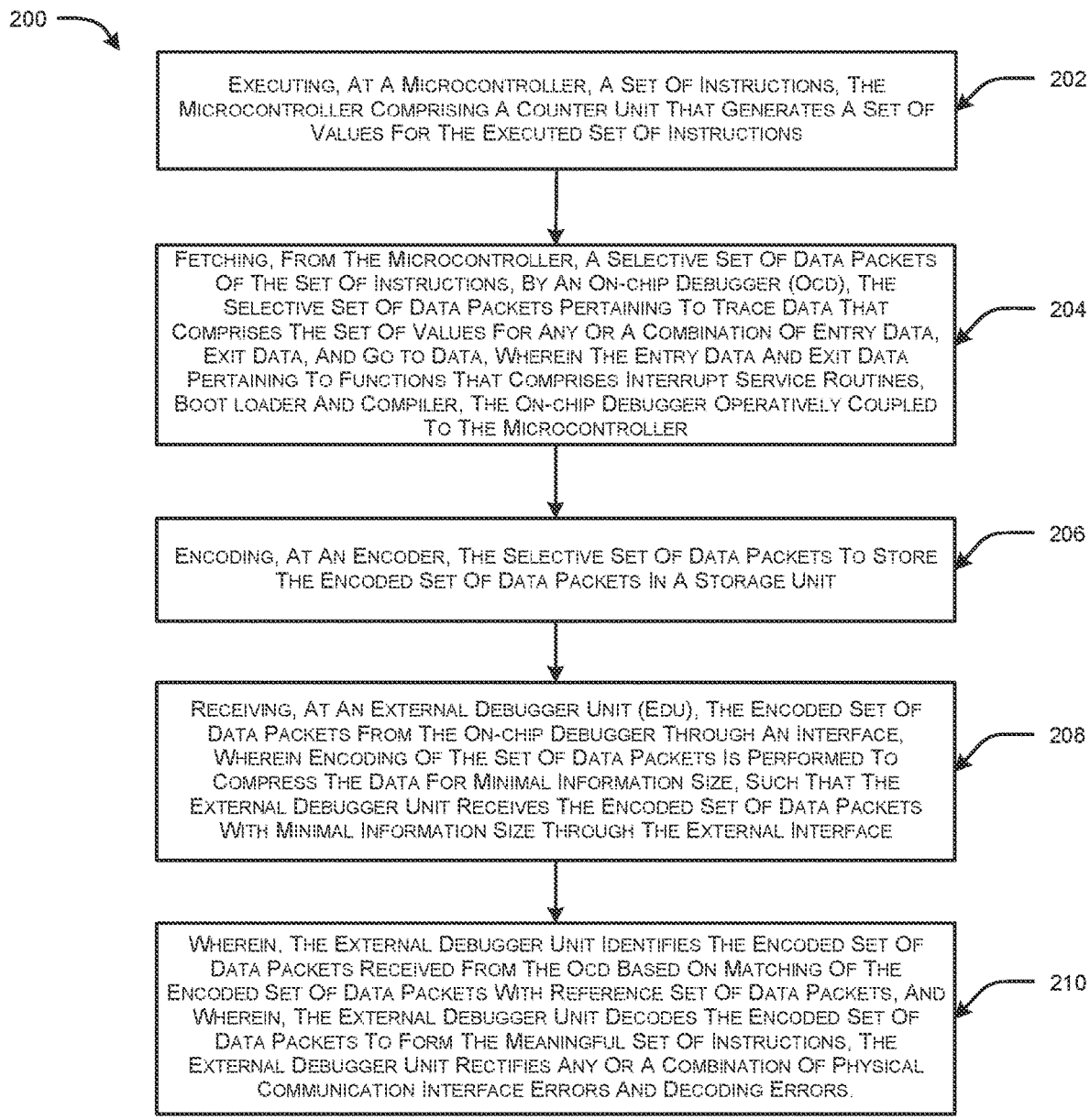
FIG. 2 illustrate an exemplary flow diagram of a method for real time debugging of microcontroller, in accordance with an embodiment of the present disclosure.

FIG. 2 illustrate an exemplary flow diagram of a method for real time debugging of microcontroller, in accordance with an embodiment of the present disclosure Referring to FIG. 2, the method 200 to operate the debugging system may include, at block 202, the microcontroller configured in the embedded device to execute the set of instructions, the microcontroller may include the counter unit to generate the set of values for the executed set of instructions.

At block 204, the on-chip debugger operatively coupled to the microcontroller, the on-chip debugger may fetch the selective set of data packets of the set of instructions from the microcontroller, the selective set of data packets pertaining to trace data that comprises the set of values for any or a combination of entry data, exit data, and interrupt data. The entry data and exit data pertaining to functions which includes interrupt service routines, bootloader and compiler introduced function because of optimizations.

At block 206, the encoder configured in the on-chip debugger, the encoder may encode the selective set of data packets to store the encoded set of data packets in the storage unit.

At block 208, an external debugger unit (EDU) operatively coupled to the on-chip debugger through the interface, the external debugger unit may receive the encoded set of data packets from the on-chip debugger through the interface. The encoding of the set of data packets is performed to compress the data for minimal information size such that the external debugger unit receives the encoded set of data packets with minimal information size through the external interface.

At block 210, the external debugger unit may identify the encoded set of data packets received from the OCD, based on matching of the encoded set of data packets with reference set of data packets, where, the external debugger unit may decode the encoded set of data packets to form the meaningful set of instructions. The external debugger unit is more intelligent and can rectify the physical communication interface errors and decoding errors. EDU has a copy of the entire firmware and can trace the firmware with the firmware copy that it contains. The EDU rectify the errors in decoding depending on the context when comparing with the EDU firmware copy.

Figure 3:
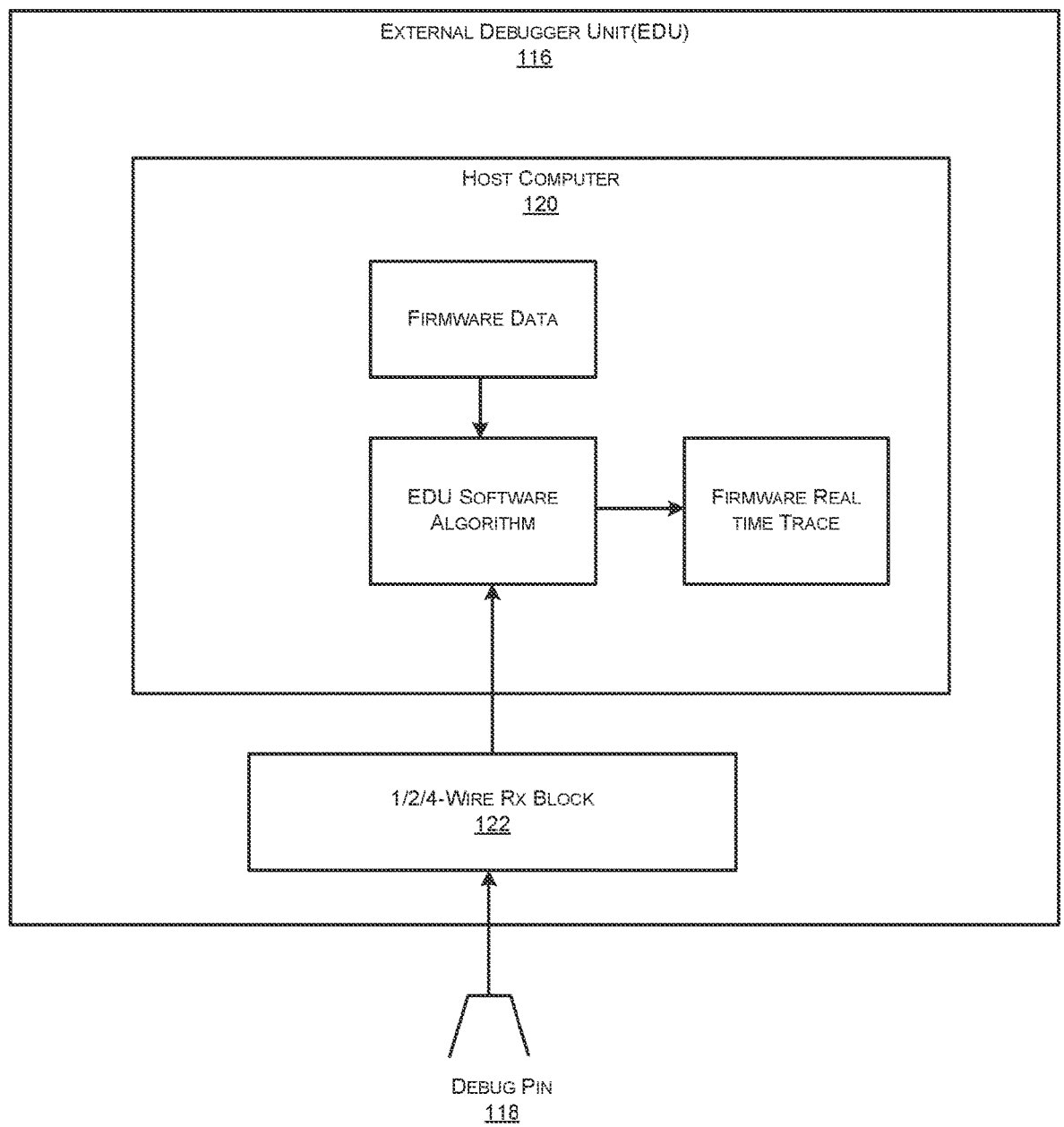
FIG. 3 illustrates an exemplary hardware component of external debugger unit, in accordance with an embodiment of the present disclosure.

FIG. 3 illustrates an exemplary hardware component of external debugger unit, in accordance with an embodiment of the present disclosure.

Referring to FIG. 3, the external debugger unit 116 may include a host computer 120, where the host computer 120 generally comprises a processor, monitor, keyboard, and/or mouse (not shown) for data input/output from/to a user. The host computer 120 comprises debug software (e.g., EDU software algorithm) and has a copy of the entire firmware data with all information of entry address and exit addresses of all functions to perform real-time tracing of the target circuit 104. The external debugger unit 116 can access the target circuit 104 through serial communications, where the host computer 120 may receive the serial data/encoded set of data packets from the on-chip debugger 108 through external interface 118 (e.g., debug pin).

The external interface 118 may provide a communication pathway between the external debugger unit 116 and the on-chip debugger 108. The external debugger unit 116 can include a receiver 122 i.e., 1/2/4 wire receiver that is configured to receive the encoded set of data packets from the on-chip debugger 108 through the external interface 118. The external debugger unit 116 may receive the encoded set of data packets with minimal information size through the external interface 118. The encoded set of data packets is identified based on matching the encoded set of data packets with the reference set of data packets that contain the copy of firmware data. The serial data/encoded set of data packets is decoded to form the meaningful set of instructions and further the errors in decoding caused due to physical medium and compression losses are rectified.

It will be apparent to those skilled in the art that the system 100 of the disclosure may be provided using some or all of the mentioned features and components without departing from the scope of the present disclosure. While various embodiments of the present disclosure have been illustrated and described herein, it will be clear that the disclosure is not limited to these embodiments only. Numerous modifications, changes, variations, substitutions, and equivalents will be apparent to those skilled in the art, without departing from the spirit and scope of the disclosure, as described in the claims.

The present disclosure provides a system that may eliminate higher memory and high-speed requirement by storing the minimal information.

The present disclosure provides a system that can send minimal information such as entry data, exit data in the on-chip debugger and code addition in firmware is avoided.

The present disclosure provides a system that can be operated at lower frequency and lower bandwidth, since minimal information is stored in the on-chip debugger.

The present disclosure provides a system in which the internal FIFO/buffer size is smaller leading to silicon area savings.

The present disclosure provides a system that can transmit only a part of program counter for entry and exit of the function in an encoded manner, thus utilizing lower bandwidth interface, and the decoding of the encoded PC may be performed at the external debugging unit effectively.

The present disclosure reduces the cost of real-time debugging by using low frequency components in the external debugger unit.

The present disclosure provides a system that can dynamically correct any error in the communication at the external debugger side, as the trace information is known.

The present disclosure provides a system that can reduce information bandwidth by splitting and taking complementary program counter bits for entry/exit calls respectively, and information may be re-constructed at the external debugger side effectively.

We claim:

1. A system for real-time debugging of microcontroller, the system comprising:
  a microcontroller configured in an embedded device to execute a set of instructions, the microcontroller comprising a counter unit that generates a set of values for the executed set of instructions;
  an on-chip debugger (OCD) operatively coupled to the microcontroller, the on-chip debugger fetches a selective set of data packets of the set of instructions from the microcontroller, the selective set of data packets pertaining to trace data that comprises the set of values for any or a combination of entry data, exit data, and goto data, wherein the entry data and exit data pertaining to functions that comprises interrupt service routines, bootloader and compiler;
  an encoder configured in the on-chip debugger, the encoder encodes the selective set of data packets to store the encoded set of data packets in a storage unit; and
  an external debugger unit (EDU) operatively coupled to the on-chip debugger through an interface, the external debugger unit configured to receive the encoded set of data packets from the on-chip debugger through the interface, wherein encoding of the set of data packets is performed to compress the data for minimal information size such that the external debugger unit receives the encoded set of data packets with minimal information size through the external interface,
  wherein, the external debugger unit is configured to identify the encoded set of data packets received from the on-chip debugger based on matching of the encoded set of data packets with reference set of data packets, and wherein, the external debugger unit decodes the encoded set of data packets to form the meaningful set of instructions, the external debugger unit rectifies one or more of physical communication interface errors or decoding errors.

2. The system as claimed in claim 1, wherein a most significant bit (MSB) of the program counter unit is pushed after the completion of the entry data and a least significant bit (LSB) of the program counter unit is pushed when the instruction is being exit.

3. The system as claimed in claim 1, wherein the external debugging unit matches the last exit data with the last entry data to decode the encoded set of data packets.

4. The system as claimed in claim 1, wherein the storage unit is configured in the on-chip debugger to store the selective set of data packets.

5. The system as claimed in claim 1, wherein the storage unit is a first in first out (FIFO) buffer.

6. The system as claimed in claim 1, wherein the interface is one or more of a 1/2/4-wire, or joint test action group (JTAG).

7. The system as claimed in claim 6, wherein the external debugger unit interacts with the on-chip debugger through the 1/2/4-wire or the JTAG interface.

8. The system as claimed in claim 1, wherein the on-chip debugger comprises a transmitter that access the encoded set of data packets from the FIFO.

9. The system as claimed in claim 1, wherein the external debugging unit comprises a decoder to decode the encoded set of data packets, wherein the reference set of data packets of the external debugging unit contains a copy of the entire firmware to trace the firmware and rectify the errors in decoding depending on the context when comparing with a firmware copy of the external debugging unit, wherein the parts of transmitted information is lost/corrupted as a part of communication from the on-chip debugger to the external debugger unit, the external debugger unit is equipped with a feature to correct these errors based on the firmware flow/context.

10. A method for real-time debugging of a microcontroller, the method comprising:
  executing, at a microcontroller, a set of instructions, the microcontroller comprising a counter unit that generates a set of values for the executed set of instructions;
  fetching, from the microcontroller, a selective set of data packets of the set of instructions, by an on-chip debugger (OCD), the selective set of data packets pertaining to trace data that comprises the set of values for any or a combination of entry data, exit data, and goto data, wherein the entry data and exit data pertaining to functions that comprises interrupt service routines, bootloader and compiler, the on-chip debugger operatively coupled to the microcontroller;
  encoding, at an encoder, the selective set of data packets to store the encoded set of data packets in a storage unit; and
  receiving, at an external debugger unit (EDU), the encoded set of data packets from the on-chip debugger through an interface, wherein encoding of the set of data packets is performed to compress the data for minimal information size, such that the external debugger unit receives the encoded set of data packets with minimal information size through the external interface,
  wherein, the external debugger unit identifies the encoded set of data packets received from the OCD based on matching of the encoded set of data packets with reference set of data packets, and wherein, the external debugger unit decodes the encoded set of data packets to form the meaningful set of instructions, the external debugger unit rectifies one or more of physical communication interface errors or decoding errors.

* * * * *